(12) United States Patent
Kamijima

(10) Patent No.: US 7,947,428 B2
(45) Date of Patent: May 24, 2011

(54) METHOD FOR FORMING PHOTOSENSITIVE POLYIMIDE PATTERN AND ELECTRONIC DEVICES HAVING THE PATTERN

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 1624 days.

(21) Appl. No.: 11/235,112

(22) Filed: Sep. 27, 2005

(65) Prior Publication Data

US 2006/0068330 A1 Mar. 30, 2006

(30) Foreign Application Priority Data

Sep. 28, 2004 (JP) ................................ 2004-282041

(51) Int. Cl.
*H01F 27/28* (2006.01)
*H01F 5/00* (2006.01)

(52) U.S. Cl. ..................... 430/311; 430/281.1; 336/200; 336/222; 333/185; 522/137; 522/18

(58) Field of Classification Search .................. None
See application file for complete search history.

(56) References Cited

U.S. PATENT DOCUMENTS

| 3,957,512 | A | | 5/1976 | Kleeberg et al. | |
| 4,243,743 | A | | 1/1981 | Hiramoto et al. | |
| 4,654,415 | A | | 3/1987 | Ahne et al. | |
| 5,019,482 | A | * | 5/1991 | Ai et al. | 430/283.1 |
| 6,146,815 | A | * | 11/2000 | Komatsu et al. | 430/331 |
| 6,710,694 | B2 | * | 3/2004 | Matsuta et al. | 336/200 |
| 7,145,427 | B2 | * | 12/2006 | Yoshida et al. | 336/200 |

FOREIGN PATENT DOCUMENTS

| JP | 55-30207 B | 8/1980 |
| JP | 5-198561 A | 8/1983 |
| JP | 59-52822 B | 12/1984 |
| JP | 60-228537 A | 11/1985 |
| JP | 63-27828 A | 2/1988 |
| JP | 1-193730 A | 8/1989 |
| JP | 4-52651 A | 2/1992 |
| JP | 5-197159 A | 8/1993 |
| JP | 8-314147 A | 11/1996 |
| JP | A 2003-255534 A | 9/2003 |

* cited by examiner

*Primary Examiner* — Daborah Chacko-Davis
(74) *Attorney, Agent, or Firm* — Oliff & Berridge, PLC

(57) ABSTRACT

The present invention provides a method for forming a photosensitive polyimide pattern 38 on a metal conductor 32, comprising carrying out the following steps (A) to (E) in this order:

(A) a step of forming an ester bond type photosensitive polyimide precursor layer 33 by applying an ester bond type photosensitive polyimide precursor composition onto the metal conductor 32;

(B) a step of forming an ion bond type photosensitive polyimide precursor layer 34 by applying an ion bond type photosensitive polyimide precursor composition onto the precursor layer 33 until the thickness of the precursor layer 34 reaches a desired thickness;

(C) a step of exposing through a mask 35 and transferring the mask pattern as a latent image 36 onto the precursor layers 33 and 34;

(D) a step of developing; and (E) a step of forming a polyimide pattern 38 by curing the developed precursor layers 33 and 34.

17 Claims, 4 Drawing Sheets

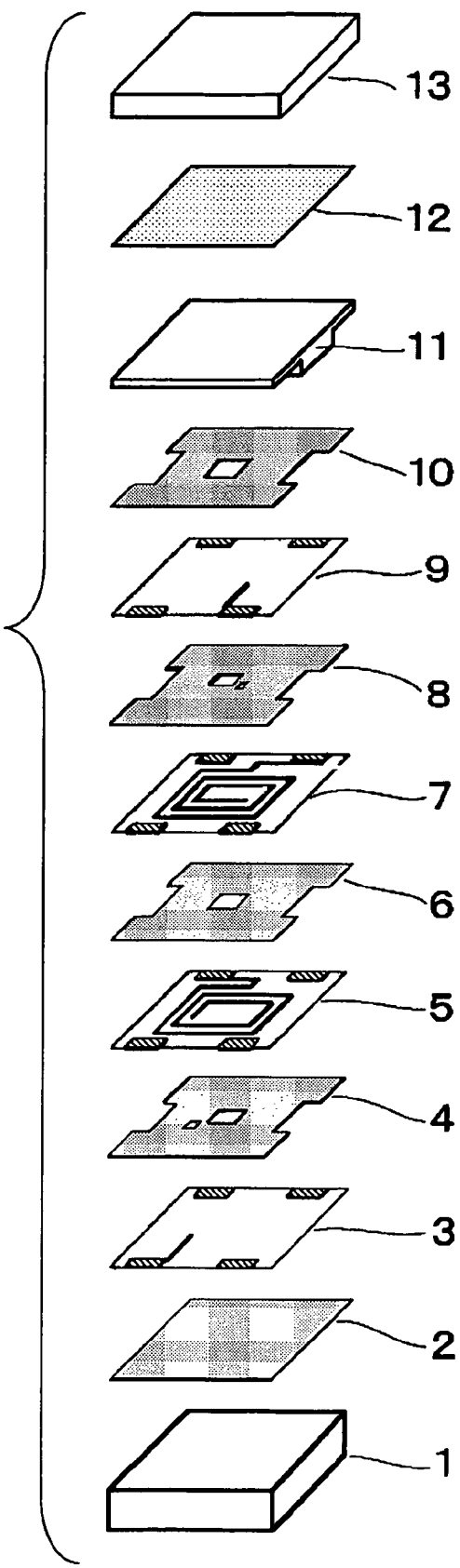

METHOD FOR FORMING PHOTOSENSITIVE POLYIMIDE PATTERN AND ELECTRONIC DEVICES HAVING THE PATTERN

This Application is an U.S. Nonprovisional Utility Patent Application that claims priority from Japanese Patent Application No. 2004-282041 filed Sep. 28, 2004, the complete disclosure of which is incorporated herein by reference.

BACKGROUND OF THE INVENTION

1. Field of the Invention

The present invention relates to a method for forming a photosensitive polyimide pattern formed on a metal film for wiring or the like. The present invention also relates to electronic devices such as semiconductor devices and thin film magnetic devices including thin film magnetic heads and thin film inductors, each including a photosensitive polyimide pattern as an insulating layer on a conductor.

2. Description of the Related Art

In electronic devices such as semiconductor devices and thin film magnetic devices including thin film magnetic heads and thin film inductors, the use of organic materials as an interlayer insulation film and a passivation film has been investigated. Among such organic materials, polyimide is excellent in heat resistance, mechanical properties and electric properties such as dielectric constant.

In these years, photosensitive type organic materials have been mainly used because they are advantageous concerning processing. In particular, photosensitive polyimide is advantageous as a highly heat resistant resin compatible with high-precision processing by use of lithography.

In a method for obtaining polyimide pattern, a polyimide pattern is obtained as follows: a polyamide acid having photosensitive groups (a photosensitive polyimide precursor) is irradiated with ultraviolet light to form cross-linking, development with a developer is carried out to remove the unexposed area, and thereafter imide rings are formed by heat curing to yield a polyimide pattern.

As such a photosensitive polyimide precursor, there may be cited an ester bond type photosensitive polyimide precursor and an ion bond type photosensitive polyimide precursor. Known examples of the ester bond type photosensitive polyimide precursor include a compound having a structure represented by the following formula (1), in the structure of formula (1) ethyl methacrylate groups as photosensitive groups being esterically bonded to the carboxyl groups in a polyamide acid molecule (see Japanese Patent Publication No. 55-30207 or Japanese Patent Laid-Open No. 60-228537):

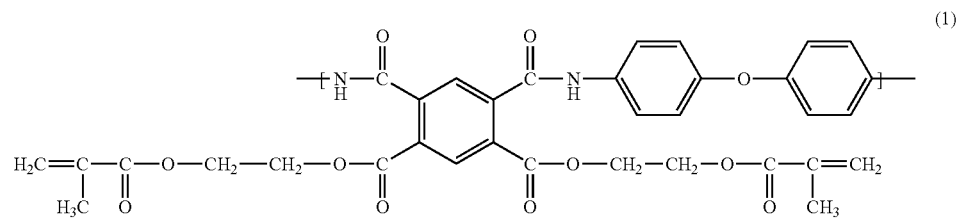

On the other hand, known examples of the ion bond type photosensitive polyimide precursor in which photosensitive groups are ionically coupled to the carboxyl groups in a polyamide acid molecule or the salts thereof, and include a compound having a structure represented by the following formula (2) (see Japanese Patent Publication No. 59-52822):

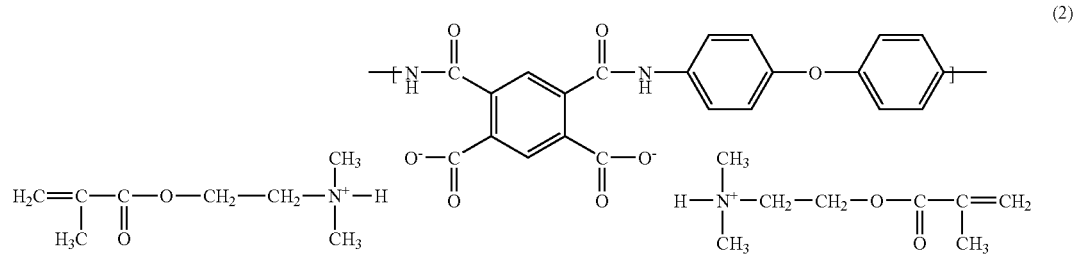

The above described ester bond type photosensitive polyimide precursor can provide a satisfactory patterning even when the patterning is carried out on the surface of a metal such as Cu; however, the stress exerted by the thus obtained polyimide film is large, causing troubles such that the substrate on which the pattern formation has been made is warped and delamination between layers is generated when multi-layer structure is formed. On the other hand, the ion bond type photosensitive polyimide precursor results in a small stress exerted by the polyimide film obtained therefrom; however, this type precursor is known to form a complex with a metal as represented by the following formula (3) when patterning is made on the surface of a metal such as Cu. Accordingly, there occurs a problem that the complex thus formed is insoluble in a developer to prevent formation of a satisfactory pattern. Consequently, it is difficult to form a polyimide pattern, exerting small stress, directly onto the surface of a metal.

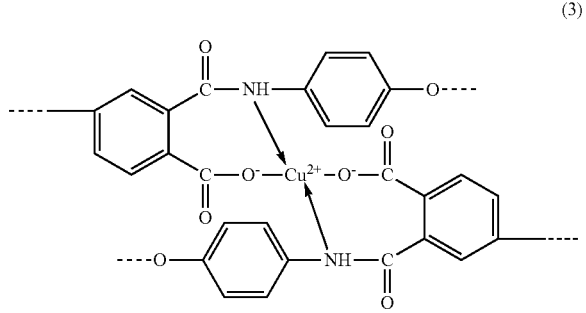

(3)

Among the hitherto known methods to avoid this problem are a method in which a substrate with metal wiring and the like is subjected to ozone treatment or the like for oxidation to form an oxide layer on the surface of the metal wiring, then an ion bond type photosensitive polyimide precursor is applied onto the oxide layer, and thereafter the substrate is subjected to exposure, development and heat treatment to yield a polyimide pattern (see Japanese Patent Laid-Open No. 5-198561), and a method in which an organosilicon compound layer is formed on a substrate with metal wiring and the like, an ion bond type photosensitive polyimide precursor is applied onto the thus formed layer, thereafter the thus processed substrate is subjected to exposure, development and heat treatment to yield a polyimide pattern, the thus processed substrate is further heated to 400° C. to convert the organosilicon compound layer into a silicon dioxide layer, and thereafter the silicon dioxide layer on the exposed area is removed (see Japanese Patent Laid-Open No. 5-197159). However, any one of these methods is complicated in processing in the sense that oxides and organic matters remaining on the exposed surface need be removed.

Japanese Patent Laid-Open No. 8-314147 proposes a method in which the diffusion of the Cu ions into the polyimide film is suppressed by adopting a way in which before application of a polyimide precursor, a very thin polyimide film, more specifically, a 100 nm or less thick prebaked polyamide film is formed, and a polyimide precursor is applied onto the prebaked film to form a pattern. In this case, for the prebaked film as a lower layer, it is described that either a photosensitive or a non-photosensitive (soluble) polyimide precursor is able to be used; in Example 1 therein an ion bond type photosensitive polyimide precursor diluted with a solvent was applied and prebaked, then the ion bond type photosensitive polyimide precursor not diluted with a solvent was applied and prebaked, and the thus processed substrate was subjected to exposure and development to yield a polyimide pattern. However, according to this method, the thin prebaked film formed as the lower layer forms copper complexes, and hence the problem involving a remaining film still persists unsolved although the remaining film is thin. In Examples 2 and 3, a non-photosensitive polyimide precursor has been used, and accordingly the copper complex formation has not been caused; but the upper-layer photosensitive polyimide pattern is removed onto a mask, so that there is an apprehension that the developer may penetrate into the inside of the pattern. Further, in such a thin film, the penetration of copper ion cannot completely be suppressed, and accordingly, there is a problem that the upper layer photosensitive polyimide precursor is involved in complex formation, and development failure is thereby caused.

SUMMARY OF THE INVENTION

An object of the present invention is to form a photosensitive polyimide pattern which is excellent in pattern precision, not complicated in patterning processing, and causes small stress.

Another object of the present invention is to provide electronic devices each having as an insulating layer such a polyimide film causing small stress.

The present inventor has made a diligent investigation for the purpose of solving the above described problems, and consequently has made it possible to provide a photosensitive polyimide pattern which is small in exerting stress and satisfactory in pattern precision by virtue of the compensation of the drawbacks borne by an ester bond type photosensitive polyimide and an ion bond type photosensitive polyimide through the use of the ester bond type photosensitive polyimide precursor for a lower layer and the ion bond type photosensitive polyimide precursor for an upper layer, both as the photosensitive polyimide precursors to be applied onto a metal such as copper.

More specifically, the present invention includes:
(1) A method for forming a photosensitive polyimide pattern on a metal conductor, comprising carrying out the following steps (A) to (E) in this order:
(A) a step of forming an ester bond type photosensitive polyimide precursor layer by applying an ester bond type photosensitive polyimide precursor composition onto the metal conductor;
(B) a step of forming an ion bond type photosensitive polyimide precursor layer by applying an ion bond type photosensitive polyimide precursor composition onto the ester bond type photosensitive polyimide precursor layer;
(C) a step of exposing to transfer a mask pattern as a latent image onto the ester bond type photosensitive polyimide precursor layer and the ion bond type photosensitive polyimide precursor layer;
(D) a step of developing the photosensitive polyimide precursor layers; and
(E) a step of forming a polyimide pattern by curing the developed ester bond type photosensitive polyimide precursor layer and ion bond type photosensitive polyimide precursor layer.
(2) The method for forming a photosensitive polyimide pattern according to the above (1), wherein the ester bond type photosensitive polyimide precursor layer formed in the step (A) has a thickness of 0.15 to 5 μm.
(3) The method for forming a photosensitive polyimide pattern according to the above (1), wherein the ester bond type photosensitive polyimide precursor layer is prebaked in the step (A), and thereafter the ion bond type photosensitive polyimide precursor layer in the step (B) is formed.

(4) The method for forming a photosensitive polyimide pattern according to the above (1), wherein the ion bond type photosensitive polyimide precursor layer is prebaked in the step (B), and thereafter the step (C) is carried out.

(5) The method for forming a photosensitive polyimide pattern according to the above (1), wherein a heat treatment to accelerate a photosensitive reaction is carried out after the step (C) and before the step (D).

(6) The method for forming a photosensitive polyimide pattern according to the above (1), wherein the metal conductor is made of copper or a copper alloy.

(7) An electronic device which comprises an insulating layer formed of a photosensitive polyimide pattern formed on a metal conductor, the photosensitive polyimide pattern obtained by collectively exposing, developing and curing a laminate structure composed of an ester bond type photosensitive polyimide precursor layer and an ion bond type photosensitive polyimide precursor layer formed on the ester bond type photosensitive polyimide precursor layer.

(8) The electronic device according to the above (7), wherein the ester bond type photosensitive polyimide precursor layer is formed with a thickness of 0.15 to 5 µm.

(9) The electronic device according to any one of the above (7) or (8) which is a thin film magnetic device having an insulating layer sandwiched by a pair of layers made of a magnetic material and having a coil conductor formed in a spiral shape and embedded in the insulating layer, wherein at least a portion of the insulating layer on the coil conductor is obtained by collectively exposing, developing and curing the laminate structure composed of the ester bond type photosensitive polyimide precursor layer and the ion bond type photosensitive polyimide precursor layer formed on the ester bond type photosensitive polyimide precursor layer.

(10) The electronic device according to the above (9), wherein the thin film magnetic device is a thin film inductor or a thin film magnetic head.

(11) The electronic device according to the above (9), wherein:
the thin film magnetic device is a common-mode choke coil comprising:
a first magnetic substrate made of a magnetic material;
a first insulating layer formed on the first magnetic substrate;
a second insulating layer formed on the first insulating layer;
a coil conductor embedded in the second insulating layer and formed in a spiral shape;
openings formed in the second insulating layer on the inner periphery and the outer periphery of the coil conductor with the first insulating layer exposed;
a magnetic layer formed by filling in at least the openings;
a second magnetic substrate fixed on the magnetic layer and made of a magnetic material; and
terminal electrodes connected to the terminals of the coil conductor and disposed across the sides of the first and second magnetic substrates; wherein:
at least a portion of the second insulating layer formed on the coil conductor is a polyimide film formed by curing the laminate structure composed of the ester bond type photosensitive polyimide precursor layer formed on the coil conductor and the ion bond type photosensitive polyimide precursor layer formed on the ester bond type photosensitive polyimide precursor layer after the laminate structure has been patterned so as to form the openings.

(12) The electronic device according to the above (11), wherein a plurality of layers of the coil conductors are formed through insulating layers, and the insulating layer formed on each of the coil conductors is a polyimide film formed by curing the laminate structure.

(13) The electronic device according to the above (11), wherein a lead terminal layer is provided on the upper or lower layer of the coil conductor for the purpose of electrically connecting the coil conductor with the terminal electrodes, through the insulating layer, and the insulating layer formed on the lead terminal layer is a polyimide film formed by curing the laminate structure.

(14) The electronic device according to any one of the above (7) to (13), wherein the metal conductor is made of copper or a copper alloy.

According to the present invention, a polyimide film pattern having a satisfactory pattern on a metal and having a small stress can be obtained.

BRIEF DESCRIPTION OF THE DRAWINGS

FIG. 1 is an exploded oblique perspective view of a chip common-mode choke coil according to an embodiment of the present invention;

DETAILED DESCRIPTION OF THE PREFERRED EMBODIMENTS

The ester bond type photosensitive polyimide precursor composition and the ion bond type photosensitive polyimide precursor composition used in the present invention each include such polyimide precursors as described in the above section of the "Description of the Related Art," as the main component, and may also include additives well known in the art such as a photopolymerization initiator to accelerate optical cross-linking reaction, a sensitizer to increase photosensitivity, an adhesive aid to improve the adhesion with the substrate, a thermopolymerization initiator to accelerate the imidization reaction, a storage stabilizer to improve the stability of the viscosity and the photosensitivity of the composition during storage and a solvent to facilitate application. Usually, commercially available photosensitive polyimide solutions include these additives.

Now, a method for forming a photosensitive polyimide pattern according to the present invention will be described below with reference to a common-mode choke coil as a thin film magnetic device to which the method concerned is applied.

Figure 2A:
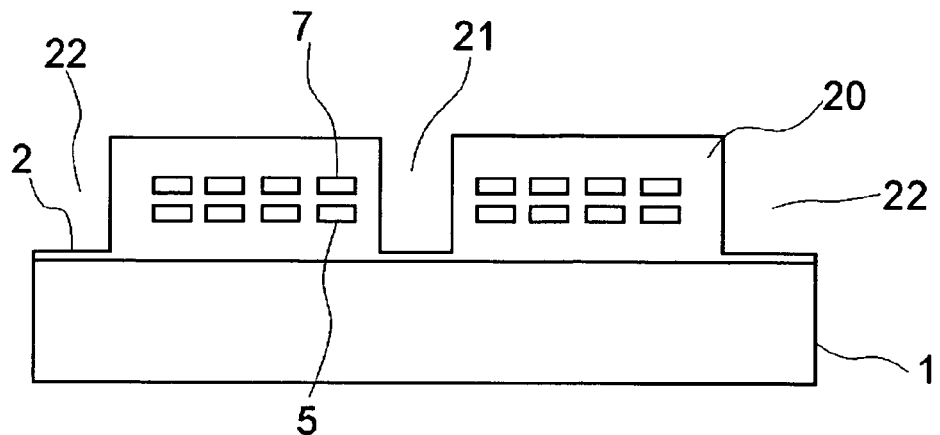
FIGS. 2A to 2C are each of a sectional flow diagram showing part of the steps for fabricating the chip common-mode choke coil illustrated in FIG. 1.
Figure 2B:
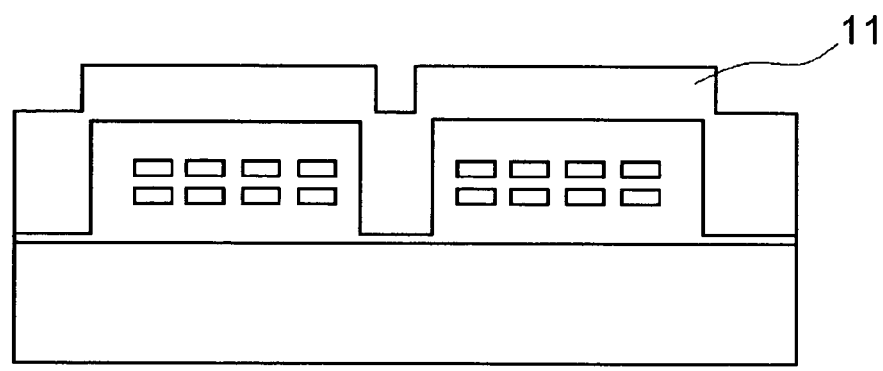
Figure 2C:
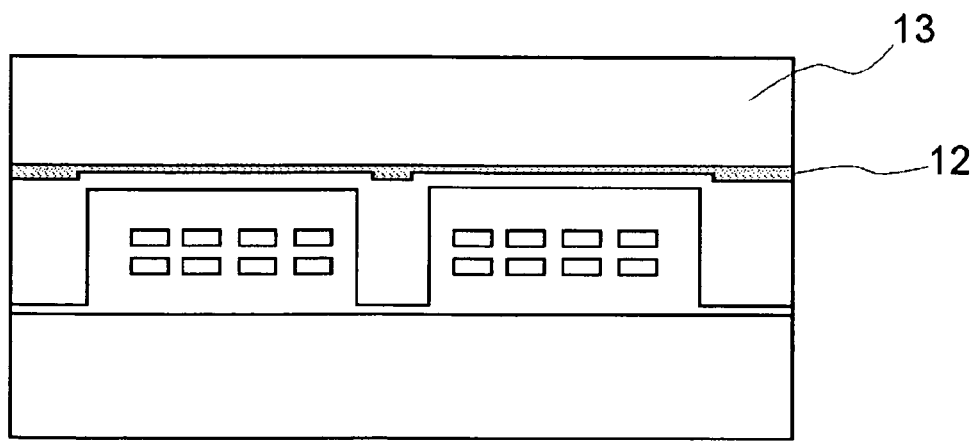

FIG. 1 is an exploded oblique perspective view for the case in which a chip common-mode choke coil is fabricated, and FIGS. 2A to 2C are each of a sectional flow diagram showing part of the steps for fabricating the choke coil concerned. In an actual fabrication, a plurality of devices is fabricated at the same time, but description is limited to one device in the present embodiment.

As shown in FIG. 1, the chip common-mode choke coil is fabricated by integrally laminating the following members on the main surface of a first magnetic substrate 1 in the order of listing: an insulating layer 2 for controlling impedance, a first lead terminal layer 3, an insulating layer 4, a first coil conductor layer (spiral coil conductor pattern) 5, an insulating layer 6, a second coil conductor layer (spiral coil conductor pattern) 7, an insulating layer 8, a second lead terminal layer 9, an insulating layer 10, a magnetic layer 11, an adhesion layer 12 and a second magnetic substrate 13.

The first magnetic substrate 1 and the second magnetic substrate 13 are made of a material such as sintered ferrite or composite ferrite, the insulating layer 2 for controlling impedance is made of a material excellent in insulation properties and satisfactory in workability such as a polyimide resin and an epoxy resin. The insulating layers 4, 6, 8 and 10 are made of a photosensitive polyimide, and are formed by the method for forming photosensitive polyimide pattern according to the present invention. The first and second lead terminal layers 3 and 9, and the first and second coil conductor layers 5 and 7 as spiral coil conductor patterns are formed by a vacuum film formation method (such as an vapor deposition method and a sputtering method) or a plating method using a metal; Cu, Al and the like are preferable, and Cu and Cu alloys can be particularly preferably used from the viewpoints of conductivity and workability. In the present embodiment, Cu is used. The magnetic layer 11 is made of a material in which a magnetic powder such as a ferrite powder is mixed in a resin such as an epoxy resin.

In the fabrication of the chip common-mode choke coil, the insulating layer 2 for controlling impedance made of an insulating resin is formed in a thickness of 1 to 20 μm on the whole main surface of the first magnetic substrate 1. For the formation method concerned, application methods such as a spin coating method, a dipping method, a spraying method or a printing method, or a thin film formation method is adopted. In particular, the use of a thin film formation method makes it possible to form a film small in variation and high in precision for the insulating layer 2 for controlling impedance. Consequently, the variation of the impedance can be reduced.

Next, a metal film is formed on the insulating layer 2 for controlling impedance by a vacuum film formation method or a plating method to form the first lead terminal 3 having a desired shape of pattern. Examples of the patterning method that can be adopted may include a method in which after a metal film has been formed over the whole surface of the insulating layer 2 for controlling impedance, a desired pattern is formed by an etching method using well known photolithography, and an additive method in which a resist film is formed on the insulating layer 2 for controlling impedance, a pattern is formed by use of well known photolithography, and thereafter a metal film is formed within the pattern.

Next, on the first lead terminal 3, the photosensitive polyimide insulating layer 4 according to the present invention is formed in a pattern shape. This pattern forms the central area and the outer peripheral area of the spiral pattern in the first coil conductor 5 to be formed in the next step, and the contact hole to connect the first lead terminal 3 and the first coil conductor 5 with each other.

Successively, the first coil conductor 5 as a spiral coil conductor pattern is formed. The formation method concerned is the same for the first lead terminal 3.

Next, the insulating layer 6, the second coil conductor 7 as a spiral coil conductor pattern, the insulating layer 8, the second lead terminal 9 and the insulating layer 10 are sequentially formed. The insulating layers 6, 8 and 10 are formed in the same manner as for the insulating layer 4, by the method for forming pattern of the photosensitive polyimide insulating layer to be described later. The second coil conductor 7 and the second lead terminal 9 are formed in the same manner as for the first lead terminal 3. In this way, a laminate 20, as shown in FIG. 2A, in which the coil conductor patterns are formed in a built-in manner on the first magnetic substrate 1, is obtained. The laminate 20 has the insulating layer 2 for controlling impedance, remaining in the central area and the outer peripheral area, and has a resin-removed area 21 (a recess area) and a resin-removed area 22 (a notched area), namely, the areas in which the insulating layer area other than the above described remaining insulating layer 2 has been removed.

Then, a magnetic powder-containing resin 11' is printed on the upper surface of the laminate 20 by the basis of the application step shown in FIG. 2B. In this case, the resin 11' is also applied onto the resin-removed areas 21 and 22 in a manner filling in these areas. Successively the resin layer concerned is cured to form a magnetic layer 11 having a patterned indented surface shown in FIG. 2B.

Successively, the surface of the magnetic layer 11 is lapped to alleviate the indentation as a flattening step. An adhesive is applied onto the flattened surface of the magnetic layer 11 to form an adhesive layer 12, and the second magnetic substrate 13 is bonded thereto.

As described above, the above description is based on the figures constrained to one device, but actually, a plurality of devices is formed at the same time on a substrate. The substrate with the devices formed thereon is cut into chips each forming one device, thereafter external electrodes are disposed across the sides of the first and second magnetic substrates so as to be connected to the terminals of the coil conductors on the outer surface of each of the chips. Through the above-described steps, the chip common-mode choke coil is fabricated.

Next, the method for forming the pattern of the photosensitive polyimide insulating layer will be described in detail.

FIGS. 3A to 3F are each of a sectional flow diagram schematically illustrating a method for forming the pattern of the photosensitive polyimide insulating layer according to the present invention. With the example presented herein, the case in which an insulating layer is formed on a coil conductor pattern will be described. The areas other than those mentioned above are omitted in FIGS. 3A-3F.

Figure 3A:
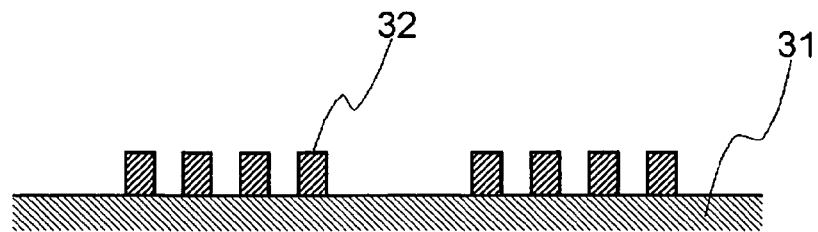
FIGS. 3A to 3F are each of a sectional flow diagram schematically illustrating a method for forming the pattern of the photosensitive polyimide insulating layer according to the present invention.
Figure 3B:
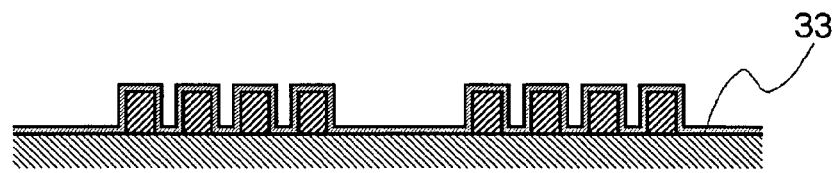

In this case, a coil conductor 32 made of Cu is formed on a substrate 31 in a patterned shape as shown in FIG. 3A. As shown in FIG. 3B, an ester bond type photosensitive polyimide precursor composition is applied onto these members to form an ester bond type photosensitive polyimide precursor layer 33. The thus formed ester bond type photosensitive polyimide precursor layer 33 may be prebaked, if necessary. The thickness of the ester bond type photosensitive polyimide precursor layer 33 is preferably 0.15 μm or more, and more preferably 0.3 μm or more, although the thickness concerned is not generally limited because it depends on the sites, substrate materials and the like to which the ester bond type photosensitive polyimide precursor layer 33 is to be applied. When this layer thickness is less than 0.15 μm, the copper complex formation of the ion bond type photosensitive polyimide precursor layer 34 to be applied in the next step is not able to be suppressed, and sometimes development failure is generated. On the other hand, the upper limit of the thickness of the ester bond type photosensitive polyimide precursor layer 33 is preferably set at 5 μm or less, and more preferably at less than 3 μm. When this layer thickness exceeds 5 μm, the stress remaining after curing becomes large, and sometimes cracks and delamination between layers are caused.

Figure 3C:
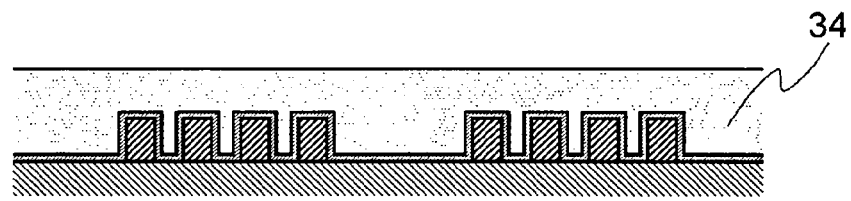

Onto the ester bond type photosensitive polyimide precursor layer 33, an ion bond type photosensitive polyimide precursor composition is applied until a desired thickness of the insulating layer is obtained to form an ion bond type photosensitive polyimide precursor layer 34. The thus formed ion bond type photosensitive polyimide precursor layer 34 may be prebaked, if necessary (FIG. 3C).

Figure 3D:
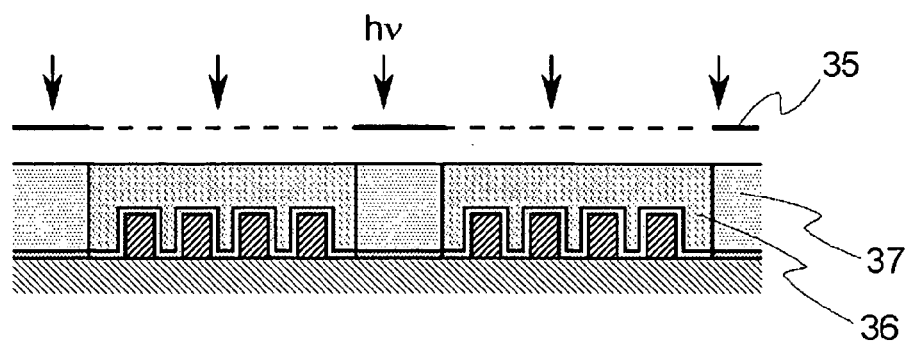

Next, as shown in FIG. 3D, a desired pattern is exposed through a mask 35. The exposure uses the light having the wavelength with which the photosensitive groups in the ion bond type photosensitive polyimide precursor layer 34 and the ester bond type photosensitive polyimide precursor layer 33 are reacted to form cross-linked structures; it is preferable to use an exposure light having a broad wavelength range such as a Hg board band. In this way, sufficient exposure light reaches the ester bond type photosensitive polyimide precursor layer 33 as the lower layer, insufficient exposure thereof being able to be prevented. In FIG. 3D, reference numerals 36 and 37 denote an exposed area (a latent image) and an unexposed area, respectively. A heat treatment to accelerate the photosensitive reaction may be carried out after exposure, as the case may be.

Figure 3E:
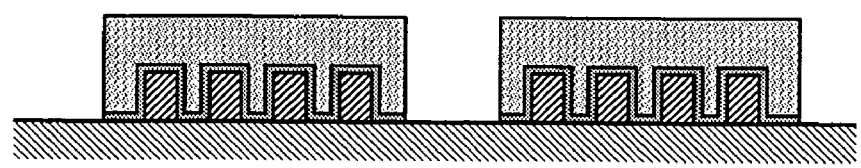

Successively, a development step is carried out to remove by dissolution the unexposed area 37 (FIG. 3E). First, the unexposed area is removed by dissolution by use of a well-known developer such as 2-methylpyrrolidone, and then rinsing is made by use of a rinsing liquid such as isopropyl alcohol.

After the unexposed area has been removed as described above, curing (imidization) is made. The imidization is a dehydration ring closure reaction to form imide rings, wherein a heat treatment is carried out in which, for example, heating is made at 400° C. for 1 hour. The heat treatment is preferably carried out in an atmosphere of an inert gas such as nitrogen for the purpose of avoiding an adverse effect due to oxygen.

Figure 3F:
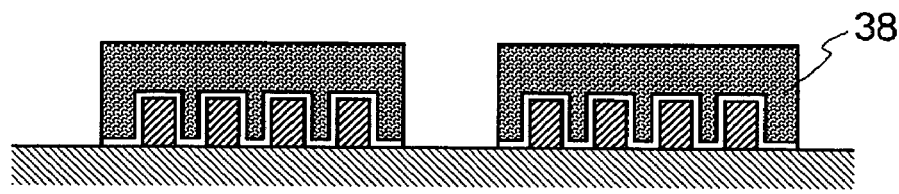

Thus, a polyimide pattern 38 shown in FIG. 3F is formed.

Now, the present invention will be described below in detail with reference to an example, but it is understood that the present invention is not limited only to the example.

Example 1

On a ferrite substrate of ϕ7.6 cm (3 inches), an 800 μm square Cu coil of 15 μm-Us and 5 μm in thickness was formed. Pimel™ G-7650E (manufactured by Asahi Kasei Corp.), as an ester bond type photosensitive polyimide precursor composition, was applied in a thickness of 1.0 μm onto the substrate with the coil thereon, then the thus processed substrate was heated at 100° C. for 10 minutes with a hot plate, and thereafter cooled down to room temperature.

Next, PHOTONEECE™ UK-5100 (manufactured by Toray Corp.) as an ion bond type photosensitive polyimide precursor composition was applied onto the thus processed substrate in a thickness of 9.0 μm, then the thus processed substrate was heated at 100° C. for 10 minutes with a hot plate, and thereafter cooled down to room temperature.

Next, by use of an exposure apparatus Canon PLA™ (manufactured by Canon Co., Ltd.), exposure was carried out with exposure wavelengths of an Hg broad band through a mask having an opening corresponding to a 1 mm square situated at the center of the coil. After exposure, for example, a heating may be made at 100° C. for 1 minute to accelerate the photosensitive reaction.

After exposure, development was made with 2-methylpyrrolidone (NMP), and rinsing was made with isopropyl alcohol (IPA). Consequently, the unexposed area was completely removed without leaving any unexposed layer areas.

Finally, the product thus obtained was heated at 400° C. for 1 hour in an atmosphere of nitrogen, for heat curing to form a polyimide pattern. The thus formed polyimide pattern was examined, and cracks, delamination and the like were not identified.

In the above-described way, the polyimide patterns were formed by varying the applied thickness of the ester bond photosensitive polyimide precursor layer. The results thus obtained are shown in Table 1 below.

TABLE 1

| Applied thickness (t in μm) of ester bond type photosensitive polyimide precursor layer | $0.1 \leq t < 0.3$ | $0.3 \leq t < 0.5$ | $0.5 \leq t < 1.0$ | $1.0 \leq t < 2.0$ | $2.0 \leq t < 3.0$ | $3.0 \leq t$ |
|---|---|---|---|---|---|---|
| Patterning of ion bond type photosensitive polyimide precursor layer | impossible | possible | possible | possible | possible | possible |
| Conditions after curing of polyimide pattern | — | No problem | No problem | No problem | No problem | Cracks and delamination |

Among the above described combinations of the materials, the cases each having the applied layer thickness of 0.3 μm or more and less than 3.0 μm permitted forming satisfactory polyimide patterns.

COMPARATIVE EXAMPLE 1

The exposure, development and curing steps were carried out in the same manner as in Example 1, except that Pimel™ G-7650E (manufactured by Asahi Kasei Corp.), as an ester bond type photosensitive polyimide precursor composition, was applied in a thickness of 10 μm, and no ion bond type photosensitive polyimide precursor was applied. Consequently, cracks were found to be formed in the insulating layers and partial delamination was found to occur.

COMPARATIVE EXAMPLE 2

The exposure, development and curing steps were carried out in the same manner as in Example 1, except that no ester bond type photosensitive polyimide precursor layer was formed and only an ionic bond photosensitive polyimide precursor composition was applied in a thickness of 10 μm. Consequently, no satisfactory polyimide pattern was obtained at the time of development.

In the above described embodiments, description has been made on the method for forming a photosensitive polyimide pattern as insulating layers in a thin film magnetic device, in particular, a chip common-mode choke coil; however, the present invention is not limited to this case, but can be applied to various fields involving semiconductor devices, printed wiring boards, light receiving devices, light emitting devices and the like, each including a photosensitive polyimide pattern formed on a conductor therein.

What is claimed is:

1. A method for forming a photosensitive polyimide pattern on a metal conductor, comprising carrying out the following steps (A) to (E) in this order:
   (A) a step of forming an ester containing photosensitive polyimide precursor layer by applying an ester containing photosensitive polyimide precursor composition onto the metal conductor, wherein the ester containing photosensitive polyimide precursor composition includes photosensitive groups bonded via an ester bond;
   (B) a step of forming an ionically coupled photosensitive polyimide precursor layer by applying an ionically coupled photosensitive polyimide precursor composition onto the ester containing photosensitive polyimide precursor layer, wherein the ionically coupled photosensitive polyimide precursor composition includes photosensitive groups coupled via an ionic bond;
   (C) a step of exposing to transfer a mask pattern as a latent image onto the ester containing photosensitive polyimide precursor layer and the ionically coupled photosensitive polyimide precursor layer;
   (D) a step of developing the photosensitive polyimide precursor layers; and
   (E) a step of forming a polyimide pattern by curing the developed ester containing photosensitive polyimide precursor layer and ionically coupled photosensitive polyimide precursor layer.

2. The method for forming a photosensitive polyimide pattern according to claim 1, wherein the ester containing photosensitive polyimide precursor layer formed in the step (A) has a thickness of 0.15 to 5 µm.

3. The method for forming a photosensitive polyimide pattern according to claim 1, wherein the ester containing photosensitive polyimide precursor layer is prebaked in the step (A), and thereafter the ionically coupled photosensitive polyimide precursor layer in the step (B) is formed.

4. The method for forming a photosensitive polyimide pattern according to claim 1, wherein the ionically coupled photosensitive polyimide precursor layer is prebaked in the step (B), and thereafter the step (C) is carried out.

5. The method for forming a photosensitive polyimide pattern according to claim 1, wherein a heat treatment to accelerate a photosensitive reaction is carried out after the step (C) and before the step (D).

6. The method for forming a photosensitive polyimide pattern according to claim 1, wherein the metal conductor is made of copper or a copper alloy.

7. An electronic device which comprises an insulating layer formed of a photosensitive polyimide pattern formed on a metal conductor, the photosensitive polyimide pattern obtained by collectively exposing, developing and curing a laminate structure composed of:
   an ester containing photosensitive polyimide precursor layer including photosensitive groups bonded via an ester bond, and
   an ionically coupled photosensitive polyimide precursor layer including photosensitive groups coupled via an ionic bond, wherein the ionically coupled photosensitive polyimide precursor layer is formed on the ester containing photosensitive polyimide precursor layer.

8. The electronic device according to claim 7, wherein the ester containing photosensitive polyimide precursor layer is formed with a thickness of 0.15 to 5 µm.

9. The electronic device according to claim 7, which is a thin film magnetic device having the insulating layer sandwiched by a pair of layers made of a magnetic material and having a coil conductor formed in a spiral shape and embedded in the insulating layer, wherein at least a portion of the insulating layer on the coil conductor is obtained by collectively exposing, developing and curing the laminate structure composed of the ester containing photosensitive polyimide precursor layer and the ionically coupled photosensitive polyimide precursor layer formed on the ester containing photosensitive polyimide precursor layer.

10. The electronic device according to claim 9, wherein the thin film magnetic device is a thin film inductor.

11. The electronic device according to claim 9, wherein the thin film magnetic device is a thin film magnetic head.

12. The electronic device according to claim 9, wherein:
   the thin film magnetic device is a common-mode choke coil comprising:
   a first magnetic substrate made of the magnetic material;
   a first insulating layer formed on the first magnetic substrate;
   a second insulating layer formed on the first insulating layer;
   the coil conductor embedded in the second insulating layer and formed in the spiral shape;
   openings formed in the second insulating layer on an inner periphery and an outer periphery of the coil conductor with the first insulating layer exposed;
   a magnetic layer formed by filling in at least the openings;
   a second magnetic substrate fixed on the magnetic layer and made of a the magnetic material; and
   terminal electrodes connected to terminals of the coil conductor and disposed across the sides of the first and second magnetic substrates; wherein:
   at least a portion of the second insulating layer formed on the coil conductor is a polyimide film formed by curing the laminate structure composed of the ester containing photosensitive polyimide precursor layer formed on the coil conductor and the ionically coupled photosensitive polyimide precursor layer formed on the ester containing photosensitive polyimide precursor layer after the laminate structure has been patterned so as to form the openings.

13. The electronic device according to claim 12, wherein a plurality of layers of the coil conductor are formed through the insulating layers, and the insulating layer formed on each of the plurality of layers of the coil conductor is the polyimide film formed by curing the laminate structure.

14. The electronic device according to claim 12, wherein a lead terminal layer is provided on an upper or a lower layer of the coil conductor for the purpose of electrically connecting the coil conductor with the terminal electrodes, through the insulating layer, and the insulating layer formed on the lead terminal layer is a polyimide film formed by curing the laminate structure.

15. The electronic device according to claim 9, wherein the coil conductor is made of copper or a copper alloy.

16. The electronic device according to claim 7, wherein the metal conductor is made of copper or a copper alloy.

17. An electronic device which comprises an insulating layer formed of a photosensitive polyimide pattern formed on a metal conductor, the photosensitive polyimide pattern obtained by collectively exposing, developing and curing a laminate structure composed of:
   an ester containing photosensitive polyimide precursor layer comprising an ester containing polyamide acid in which photosensitive groups are bonded to the polyamide acid via an ester bond, and
   an ionically coupled photosensitive polyimide precursor layer comprising an ionically coupled polyamide acid in which photosensitive groups are coupled to the polyamide acid via an ionic bond, wherein the ionically coupled photosensitive polyimide precursor layer is formed on the ester containing photosensitive polyimide precursor layer.

* * * * *